US011824024B2

(12) United States Patent
Hozumi

(10) Patent No.: US 11,824,024 B2
(45) Date of Patent: Nov. 21, 2023

(54) SEMICONDUCTOR MODULE AND METHOD OF MANUFACTURING SEMICONDUCTOR MODULE

(71) Applicant: Fuji Electric Co., Ltd., Kanagawa (JP)

(72) Inventor: Yasuaki Hozumi, Tokyo (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 0 days.

(21) Appl. No.: 17/824,843

(22) Filed: May 25, 2022

(65) Prior Publication Data

US 2022/0285301 A1 Sep. 8, 2022

Related U.S. Application Data

(62) Division of application No. 16/838,207, filed on Apr. 2, 2020, now Pat. No. 11,424,203.

(30) Foreign Application Priority Data

May 13, 2019 (JP) .................................. 2019-090804

(51) Int. Cl.
*H01L 23/00* (2006.01)

(52) U.S. Cl.
CPC .............. *H01L 24/05* (2013.01); *H01L 24/03* (2013.01); *H01L 24/48* (2013.01);
(Continued)

(58) Field of Classification Search
CPC ......... H01L 24/01; H01L 24/05; H01L 24/06; H01L 24/48; H01L 24/03; H01L 29/41766; H01L 23/3114; H01L 23/562; H01L 29/66734; H01L 29/66727; H01L 23/49524; H01L 23/49575; H01L 23/4952; H01L 23/4334; H01L 23/49562; H01L 23/49568; H01L 29/7813; H01L 23/49513;
(Continued)

(56) References Cited

U.S. PATENT DOCUMENTS 9,985,125 B1 5/2018 Sono
2004/0256730 A1 12/2004 Kato et al.
(Continued)

FOREIGN PATENT DOCUMENTS

JP H5-102330 A 4/1993
JP H06-140409 A 5/1994
(Continued)

OTHER PUBLICATIONS

Japanese Office Action dated Apr. 11, 2023 in a counterpart Japanese patent application No. 2019-090804. (A machine translation (not reviewed for accuracy) attached.).
(Continued)

*Primary Examiner* — Mouloucoulaye Inoussa
(74) *Attorney, Agent, or Firm* — CHEN YOSHIMURA LLP

(57) ABSTRACT

A semiconductor module includes: a semiconductor device; a bonding layer that is arranged on the semiconductor device, contains nickel or copper, and is electrically connected to the semiconductor device; a solder portion containing gold, disposed on the bonding layer; and a protective layer disposed directly on the bonding layer, covering an outer peripheral edge of the bonding layer.

20 Claims, 6 Drawing Sheets

(52) U.S. Cl.
CPC ............... *H01L 2224/0221* (2013.01); *H01L 2224/02215* (2013.01); *H01L 2224/03825* (2013.01); *H01L 2224/04042* (2013.01); *H01L 2224/05147* (2013.01); *H01L 2224/05155* (2013.01); *H01L 2224/05644* (2013.01)

(58) Field of Classification Search
CPC ....... H01L 29/401; H01L 29/45; H01L 23/26; H01L 21/02378; H01L 29/7811; H01L 21/76895; H01L 29/7827; H01L 29/1095; H01L 21/76841; H01L 23/53266; H01L 29/861; H01L 2224/03825; H01L 2224/0221; H01L 2224/05644; H01L 2224/04042; H01L 2224/0603; H01L 2224/05147; H01L 2224/05155; H01L 2224/02215; H01L 2224/05019; H01L 2224/05124; H01L 2224/40151; H01L 2224/73263; H01L 2224/48247; H01L 2224/37124; H01L 2224/03464; H01L 2224/48245; H01L 2224/48463; H01L 2924/13055; H01L 2224/05024; H01L 2224/73265; H01L 2224/04026; H01L 2224/06181
USPC ... 257/329, 666, E23.031, E29.262, E21.19; 438/585, 118
See application file for complete search history.

(56) References Cited

U.S. PATENT DOCUMENTS

| | | |
|---|---|---|
| 2008/0305582 A1 | 12/2008 | Fillion et al. |
| 2010/0157568 A1 | 6/2010 | Ewe et al. |
| 2012/0068258 A1 | 3/2012 | Ono et al. |
| 2013/0069211 A1 | 3/2013 | Meyer-Berg et al. |
| 2013/0146991 A1 | 6/2013 | Otremba et al. |
| 2013/0292684 A1 | 11/2013 | Nikitin et al. |
| 2015/0235925 A1 | 8/2015 | Nakata et al. |
| 2016/0005703 A1 | 1/2016 | Nakata et al. |
| 2016/0020276 A1 | 1/2016 | Lu |
| 2016/0104666 A1 | 4/2016 | Gowda et al. |
| 2017/0089957 A1 | 3/2017 | Takada et al. |
| 2017/0170126 A1 | 6/2017 | Kuribayashi |
| 2017/0317016 A1 | 11/2017 | Heinriich et al. |
| 2018/0138136 A1 | 5/2018 | Tonegawa |
| 2019/0109065 A1 | 4/2019 | Hashizume et al. |
| 2019/0172812 A1 | 6/2019 | Okabe et al. |
| 2019/0341308 A1* | 11/2019 | Urakami ............ H01L 29/7397 |
| 2019/0371932 A1 | 12/2019 | Hashizume et al. |
| 2019/0386106 A1 | 12/2019 | Kumada et al. |
| 2020/0020797 A1 | 1/2020 | Suzuki et al. |
| 2020/0203496 A1 | 6/2020 | Tonegawa |

FOREIGN PATENT DOCUMENTS

| | | |
|---|---|---|
| JP | 2000-277512 A | 10/2000 |
| JP | 2001-189309 A | 7/2001 |
| JP | 2005-019798 A | 1/2005 |
| JP | 2005-079462 A | 3/2005 |
| JP | 2014-165335 A | 9/2014 |
| JP | 2016-086069 A | 5/2016 |
| JP | 2018-067592 A | 4/2018 |
| WO | 2014/037996 A1 | 3/2014 |
| WO | 2014/136303 A1 | 2/2017 |
| WO | 2019/069580 A1 | 4/2019 |

OTHER PUBLICATIONS

Japanese Office Action dated Sep. 19, 2023 in a counterpart Japanese patent application No. 2019-090804. (A machine translation (not reviewed for accuracy) attached.).

* cited by examiner

SEMICONDUCTOR MODULE AND METHOD OF MANUFACTURING SEMICONDUCTOR MODULE

BACKGROUND OF THE INVENTION

Technical Field

The present invention relates to a semiconductor module and a method of manufacturing the semiconductor module.

Background Art

Conventionally, semiconductor modules that include semiconductor devices are used. Such semiconductor modules include a semiconductor device and an insulating substrate which supports the semiconductor device, and wires which connect the semiconductor device to an external unit are solder-bonded to electrodes of the semiconductor device.

The semiconductor module includes a metal-oxide-semiconductor field-effect transistor (MOSFET), an insulated-gate bipolar transistor (IGBT), a freewheeling diode (FWD), or the like as the semiconductor device, for example.

Accordingly, semiconductor modules are subjected to thermal cycling tests that simulate the usage environment in order to evaluate reliability.

In a semiconductor module, one of the locations upon which stress acts as a result of thermal cycling is a protective layer that protects the electrodes to which wires that connect the semiconductor device to an external unit are solder-bonded.

The electrodes of the semiconductor device and the wires that are connected to those electrodes are connected using solder. Moreover, the area surrounding the electrodes is covered by the protective layer. The protective layer is made of a resin, while the electrodes to which the protective layer adheres are made of metal, and therefore the degree of thermal expansion of both materials is different.

The electrodes of the semiconductor device include a bonding layer which is connected to the circuits of the semiconductor device and an anti-oxidation layer which is arranged on the bonding layer and prevents the bonding layer from oxidizing.

For example, the bonding layer is made of nickel, the anti-oxidation layer is made of gold, and the protective layer is made of a polyimide. In the electrodes to which wires are solder-bonded, the anti-oxidation layer portions are covered by the protective layer.

The polyimide that is used for the protective layer exhibits low adhesive strength with the gold forming the anti-oxidation layer, and therefore subjecting the semiconductor device to thermal cycling tests creates stress on the plane of adhesion between the anti-oxidation layer and the protective layer, which can cause the protective layer to peel from the anti-oxidation layer and result in reduced insulation.

Therefore, Patent Document 1, for example, proposes interposing an amorphous silicon film which exhibits high adhesive strength with polyimides between a polyimide forming a protective layer and an aluminum film forming an electrode in order to improve the adhesive strength between the polyimide and the aluminum film.

Moreover, Patent Document 2 proposes interposing a hexamethyldisilane film which exhibits high adhesive strength with polyimides between a polyimide forming a protective layer and an aluminum film forming an electrode in order to improve the adhesive strength between the polyimide and the aluminum film.

RELATED ART DOCUMENTS

Patent Documents

Patent Document 1: Japanese Patent Application Laid-Open Publication No. 2000-277512

Patent Document 2: Japanese Patent Application Laid-Open Publication No. 2001-189309

SUMMARY OF THE INVENTION

In the technologies proposed in Patent Documents 1 and 2 as described above, when the material to which the polyimide adheres in the electrodes of the semiconductor device is a material other than aluminum, adhesion of the polyimide can potentially suffer.

The present specification aims to provide a semiconductor module including a protective layer which exhibits high bonding strength with an electrode.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a semiconductor module, comprising: a semiconductor device; a bonding layer that is arranged on the semiconductor device, contains nickel or copper, and is electrically connected to the semiconductor device; a solder portion containing gold, disposed on the bonding layer; and a protective layer disposed directly on the bonding layer, covering an outer peripheral edge of the bonding layer.

In this semiconductor module, an outer peripheral edge of the solder portion may coincide with an inner peripheral edge of the protective layer.

Moreover, in this semiconductor module, an outer peripheral edge of the solder portion may be positioned further inwards than an inner peripheral edge of the protective layer.

In particular, in this semiconductor module, between the outer peripheral edge of the solder portion and the inner peripheral edge of the protective layer, the bonding layer may be exposed.

Furthermore, in this semiconductor module, an arithmetic average roughness of a surface of a portion of the bonding layer on which the protective layer may be arranged be greater than or equal to 1 μm and less than or equal to 6 μm.

In addition, in this semiconductor module, the protective layer may contain polyimide or polyamide.

In another aspect, the present disclosure provides a method of manufacturing a semiconductor module, comprising: forming, on a semiconductor device, a bonding layer containing nickel or copper so as to be electrically connected to the semiconductor device; forming an anti-oxidation layer that contains gold on the bonding layer except for on an outer peripheral portion of the bonding layer including an outer peripheral edge of the bonding layer; forming a protective layer directly on the bonding layer so as to cover the outer peripheral edge of the bonding layer; and bonding a region of the bonding layer on which the anti-oxidation layer is formed to a wire using solder.

In this method of manufacturing a semiconductor module, the forming of the anti-oxidation layer may include: forming a layer that contains gold over an entire surface of the bonding layer; and removing a portion of said layer containing gold that is on the outer peripheral portion of the bonding layer so as to form the anti-oxidation layer. Further, the removing of the portion of said layer containing gold that is on the outer peripheral portion of the bonding layer may be performed so as to cause an exposed surface of the outer peripheral portion of the bonding layer to have an arithmetic average roughness of greater than or equal to 1 µm and less than or equal to 6 µm.

In this method of manufacturing a semiconductor module, the anti-oxidation layer and the protective layer may be formed so that an outer peripheral edge of the anti-oxidation layer coincides with as an inner peripheral edge of the protective layer.

The semiconductor module disclosed in the present specification as described above includes a protective layer which exhibits high bonding strength with an electrode.

Moreover, the method of manufacturing a semiconductor module disclosed in the present specification as described above makes it possible to produce a semiconductor module including a protective layer which exhibits high bonding strength with an electrode. It is to be understood that both the foregoing general description and the following detailed description are exemplary and explanatory, and are intended to provide further explanation of the invention as claimed.

DETAILED DESCRIPTION OF EMBODIMENTS

Next, preferred embodiments of a semiconductor module to be disclosed in the present specification will be described with reference to figures. Note, however, that the technical scope of the present invention is not limited to these embodiments and includes both the invention as set forth in the claims as well as equivalents thereof.

Figure 1A:
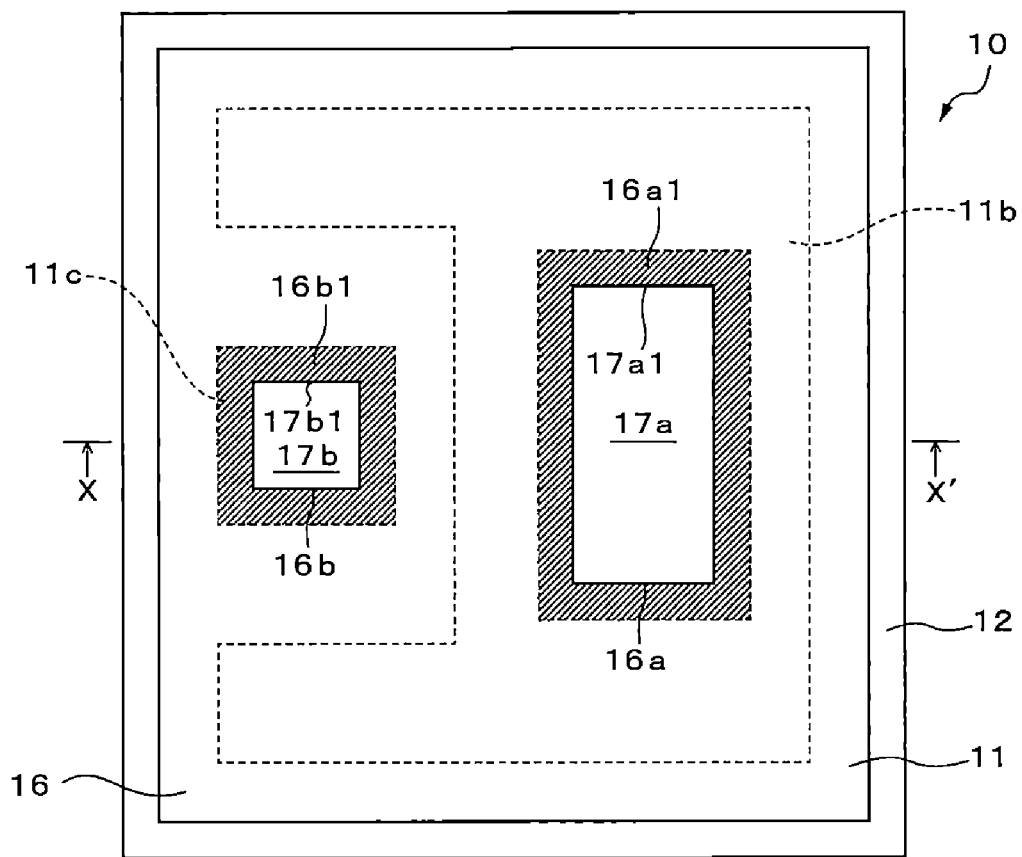
FIG. 1A is a plan view of an embodiment of a semiconductor module disclosed in the present specification.
Figure 1B:
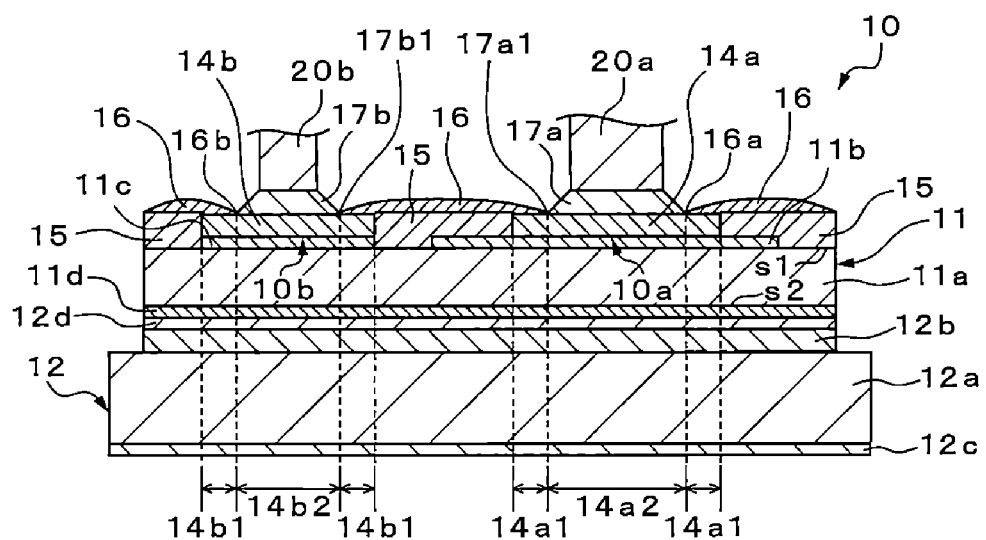
FIG. 1B is a cross-sectional view taken along line X-X'.

FIG. 1A is a plan view of an embodiment of a semiconductor module disclosed in the present specification, and FIG. 1B is a cross-sectional view taken along line X-X'.

A semiconductor module 10 includes a semiconductor device 11 and an insulating substrate 12 which supports the semiconductor device 11. The semiconductor module 10 includes a MOSFET as the semiconductor device 11. Wires 20a and 20b which electrically connect the semiconductor device 11 to an external unit are solder-bonded to the semiconductor device 11. Moreover, the semiconductor module 10 may be housed within a casing (not illustrated in the figures). Note that in FIG. 1A, the wires are not explicitly depicted.

The semiconductor device 11 includes a main device body 11a, a source electrode 11b, a gate electrode 11c, and a drain electrode 11d. The source electrode 11b and the gate electrode 11c are arranged on a first surface s1 of the main device body 11a, and the drain electrode 11d is arranged on a second surface s2 of the main device body 11a.

Moreover, on the first surface s1, the semiconductor module 10 includes a first protective layer 15 which covers portions other than where the source electrode 11b and the gate electrode 11c are arranged. The first protective layer 15 is electrically insulating and is made of a polyimide or a polyamide, for example.

The insulating substrate 12 supports the semiconductor device 11 and dissipates heat generated by the semiconductor device 11. The insulating substrate 12 includes a main substrate 12a, a circuit substrate 12b, and a metal plate 12c.

The main substrate 12a is electrically insulating and thermally conductive and provides mechanical strength for supporting the semiconductor device 11. The main substrate 12a is made of a ceramic such as aluminum nitride, for example.

Via a solder layer 12d, the circuit substrate 12b is electrically connected to the drain electrode 11d and bonds the semiconductor device 11 to the insulating substrate 12. Here, the circuit substrate 12b may be a copper plate which electrically connects wiring (not illustrated in the figure) to the drain electrode 11d. The circuit substrate 12b is electrically connected to a unit external to the semiconductor device 11 via wiring (not illustrated in the figure).

The metal plate 12c is bonded to a chassis or the like (not illustrated in the figure) to fix the semiconductor module 10 to the chassis and also conducts heat generated by the semiconductor module 10 to the chassis. The metal plate 12c is made of a metal with high thermal conductivity such as copper, for example.

The dimensions of the main substrate 12a can be determined as appropriate based on the dimensions of the semiconductor device 11. For example, when the dimensions of the semiconductor device 11 are 10 mm in length by 10 mm in width by 1 mm in thickness, the dimensions of the main substrate 12a may be set to 30 mm in length by 30 mm in width by 0.5 mm in thickness, and the dimensions of the metal plate 12c may be set to 25 mm in length by 25 mm in width by 1 mm in thickness.

The semiconductor module 10 includes a first electrode structure 10a which electrically connects the source electrode 11b of the semiconductor device 11 and the wire 20a as well as a second electrode structure 10b which electrically connects the gate electrode 11c of the semiconductor device 11 and the wire 20b. The outer periphery of the source electrode 11b is covered by the protective layer 15, and an interior portion which is not covered by the protective layer 15 forms a recess. Similarly, the gate electrode 11c is arranged within a recess surrounded by the protective layer 15. The outer peripheries of the source electrode 11b and the gate electrode 11c may be covered by the protective layer 15 but do not necessarily need to be covered. The outlines of the recesses may take any shape, including circular shapes, but from a practical perspective it is preferable that these shapes be rectangular when viewed in a plan view. Here, the outlines of the recesses will be described as being rectangular in shape. Similarly, a bonding layer 14a and a bonding layer 14b (described later) may also take any shape, including circular shapes, but from a practical perspective it is preferable that these shapes be rectangular when viewed in a plan view, and therefore here these shapes will be described as being rectangular.

Next, the first electrode structure 10a will be described below. The first electrode structure 10a includes the bonding layer 14a and a solder portion 17a. The bonding layer 14a is electrically conductive and is electrically connected to inside of the semiconductor device 11 via the source electrode 11b. The bonding layer 14a has a rectangular shape when viewed in a plan view and is arranged on top of and near the center of the source electrode 11b. The source electrode 11b is made of aluminum or an aluminum alloy, for example.

It is preferable that the thickness of the source electrode 11b be in the range of 3 µm to 6 µm. Setting the thickness of the source electrode 11b to at least 3 µm makes it possible to achieve sufficient electrical properties and mechanical strength as a conductor layer. Moreover, if the thickness of the source electrode 11b is greater than 6 µm, warping of the source electrode 11b can result in stress on the main device body 11a.

The bonding layer 14a of the first electrode structure 10a is arranged on the source electrode 11b and is electrically connected to the source electrode 11b. The bonding layer 14a is interposed in the solder bond between the source electrode 11b and the solder portion 17a. The bonding layer 14a is rectangular when viewed in a plan view, and the periphery thereof is covered by the protective layer 15. The bonding layer 14a is made of nickel, a nickel alloy, copper, or a copper alloy.

Figure 2:
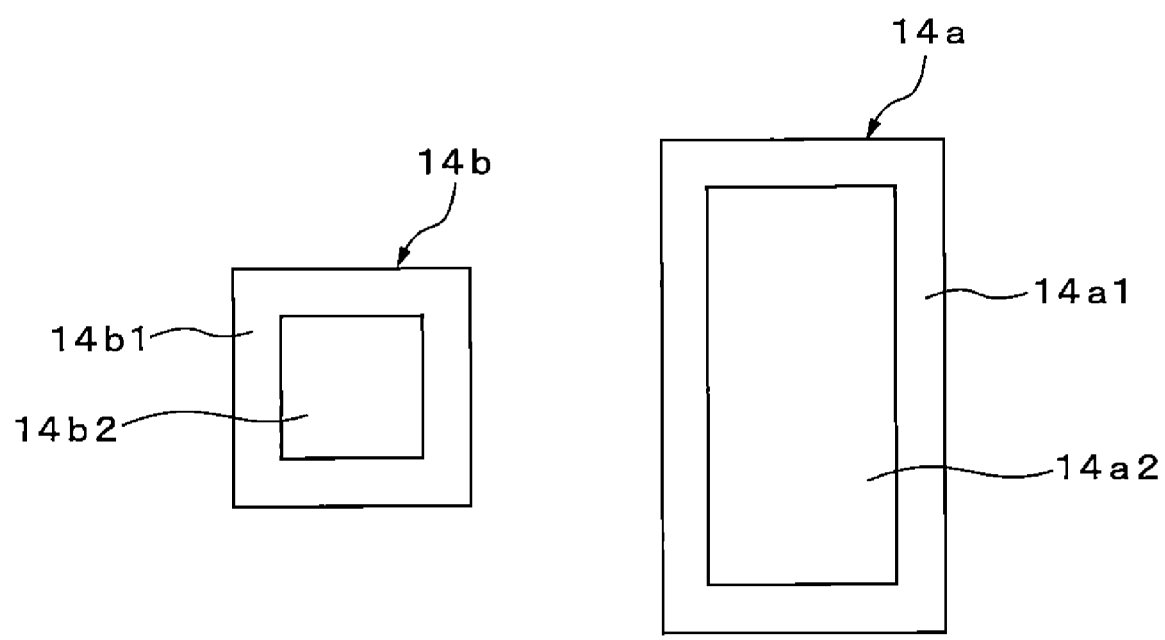
FIG. 2 is a drawing for explaining bonding layers.

As illustrated in FIG. 2, the bonding layer 14a includes a first region 14a1 which is arranged along the outer peripheral edge and a second region 14a2 which is arranged on the inner side of the first region 14a1. In the semiconductor module 10, the first region 14a1 and the second region 14a2 contact one another. In other words, the first region 14a1 is a region arranged along the outer peripheral edge of the bonding layer 14a, and the second region 14a2 is the region on the inner side of the first region 14a1.

The first region 14a1 is a region covered by a protective layer 16 (described later). The second region 14a2 is the region in which the solder portion 17a is arranged.

The first region 14a1 has a prescribed width and is arranged along the outer peripheral edge of the bonding layer 14a. From the perspective of bonding the second protective layer 16 to the bonding layer 14a with sufficient bonding strength, it is preferable that the width of the first region 14a1 be at least 30 µm. The upper limit for the width of the first region 14a1 can be determined as appropriate based on the dimensions of the bonding layer 14a or the solder portion 17a.

Moreover, from the perspective of bonding the second protective layer 16 (described later) with sufficient strength to the bonding layer 14a by virtue of mating with irregularities in the surface of the first region 14a1, it is preferable that the arithmetic average roughness of the surface of the first region 14a1 be greater than or equal to 1 µm and less than or equal to 6 µm.

It is preferable that the thickness of the bonding layer 14a be in the range of 3 µm to 6 µm. Setting the thickness of the bonding layer 14a to at least 3 µm makes it possible to achieve sufficient electrical properties and mechanical strength as a conductor layer. Moreover, if the thickness of the bonding layer 14a is greater than 6 µm, warping of the bonding layer 14a can result in stress on the semiconductor device 11.

The solder portion 17a of the first electrode structure 10a is arranged on the second region 14a2 of the bonding layer 14a and is electrically connected to the bonding layer 14a. Moreover, the solder portion 17a electrically connects the bonding layer 14a and the wire 20a. The solder portion 17a is made of a solder containing gold. Furthermore, the solder portion 17a may be an alloy into which the material forming the bonding layer 14a mixes when soldered to the bonding layer 14a.

Next, the second electrode structure 10b will be described below. The second electrode structure 10b includes the bonding layer 14b and a solder portion 17b. The bonding layer 14b is electrically conductive and is electrically connected to the semiconductor device 11 via the gate electrode 11c. The bonding layer 14b has a rectangular shape when viewed in a plan view and has the same outline as the gate electrode 11c. The gate electrode 11c is made of aluminum or an aluminum alloy, for example. The above description of the thickness of the source electrode 11b of the first electrode structure 10a can also be applied to the gate electrode 11c as appropriate.

The bonding layer 14b of the second electrode structure 10b is arranged on the gate electrode 11c and is electrically connected to the gate electrode 11c. The bonding layer 14b is interposed in the solder bond between the gate electrode 11c and the solder portion 17b. The bonding layer 14b has a rectangular shape when viewed in a plan view and has the same outline as the gate electrode 11c. The bonding layer 14b is made of nickel, a nickel alloy, copper, or a copper alloy.

As illustrated in FIG. 2, the bonding layer 14b includes a first region 14b1 which is arranged along the outer peripheral edge and a second region 14b2 which is arranged on the inner side of the first region 14b1.

The first region 14b1 is a region covered by the protective layer 16. The second region 14b2 is the region in which the solder portion 17b is arranged.

The above description of the first region 14a1 and the second region 14a2 of the bonding layer 14a of the first electrode structure 10a can also be applied to the first region 14b1 and the second region 14b2 of the second electrode structure 10b as appropriate.

Moreover, the above description of the thickness of the bonding layer 14a of the first electrode structure 10a can also be applied to the bonding layer 14b of the second electrode structure 10b as appropriate.

The solder portion 17b of the second electrode structure 10b is arranged on the second region 14b2 of the bonding layer 14b and is electrically connected to the bonding layer 14b. Moreover, the solder portion 17b electrically connects the bonding layer 14b and the wire 20b. The solder portion 17b is made of a solder containing gold. Furthermore, the solder portion 17b may be an alloy into which the material forming the bonding layer 14b mixes when soldered to the bonding layer 14b.

The semiconductor module 10 includes the second protective layer 16, which covers a region excluding the solder portions 17a and 17b on the first surface s1 of the semiconductor device 11.

The second protective layer 16 is arranged directly on the first region 14a1 of the bonding layer 14a of the first electrode structure 10a and covers the outer peripheral edge of the bonding layer 14a. A second region 14a2-side edge 16a of the second protective layer 16 is arranged on the first region 14a1 and contacts an edge 17a1 of the solder portion 17a. In other words, the inner peripheral edge of the second protective layer 16 contacts the outer peripheral edge of the solder portion 17a. As illustrated by the hatching in FIG. 1A, the second protective layer 16 bonds (adheres) to the surface of the first region 14a1 via a bonding surface 16a1 between the second protective layer 16 and the first region 14a1. The bonding surface 16a1 has a ring-shaped shape which surrounds the solder portion 17a.

Moreover, the second protective layer 16 is arranged directly on the first region 14b1 of the bonding layer 14b of the second electrode structure 10b and covers the outer peripheral edge of the bonding layer 14b. A second region 14b2-side edge 16b of the second protective layer 16 is arranged on the first region 14b1 and contacts an edge 17b1 of the solder portion 17b. In other words, the inner peripheral edge of the second protective layer 16 contacts the outer peripheral edge of the solder portion 17b. As illustrated by the hatching in FIG. 1A, the second protective layer 16 bonds (adheres) to the surface of the first region 14b1 via a bonding surface 16b1 between the second protective layer 16 and the first region 14b1. The bonding surface 16b1 has a ring-shaped shape which surrounds the solder portion 17b.

The second protective layer 16 is electrically insulating and is made of a polyimide or a polyamide, for example.

In the semiconductor module according to the present embodiment as described above, the respective bonding layers of the first electrode structure and the second electrode structure exhibit high bonding strength with the second protective layer, thereby preventing the second protective layer from peeling from the bonding layers. Therefore, the first electrode structure and the second electrode structure are protected by the second protective layer, and the electrical insulation properties are also maintained, which improves the reliability of the semiconductor module.

When the semiconductor device undergoes warping as a result of temperature changes or the like in the semiconductor module 10, for example, shear stress can occur between the second protective layer and the surfaces of the first regions of the bonding layers. The second protective layer is bonded (adhered) to the surfaces of the first regions by the bonding surfaces between the second protective layer and the first regions, and therefore the shear stress applied per unit area of the bonding surface between the second protective layer and the first regions of the bonding layers is small, which makes the second protective layer less prone to peeling from the first surfaces of the bonding layers.

Next, a modification example of the semiconductor module according to the present embodiment as described above will be described below with reference to FIGS. 3A and 3B.

Figure 3A:
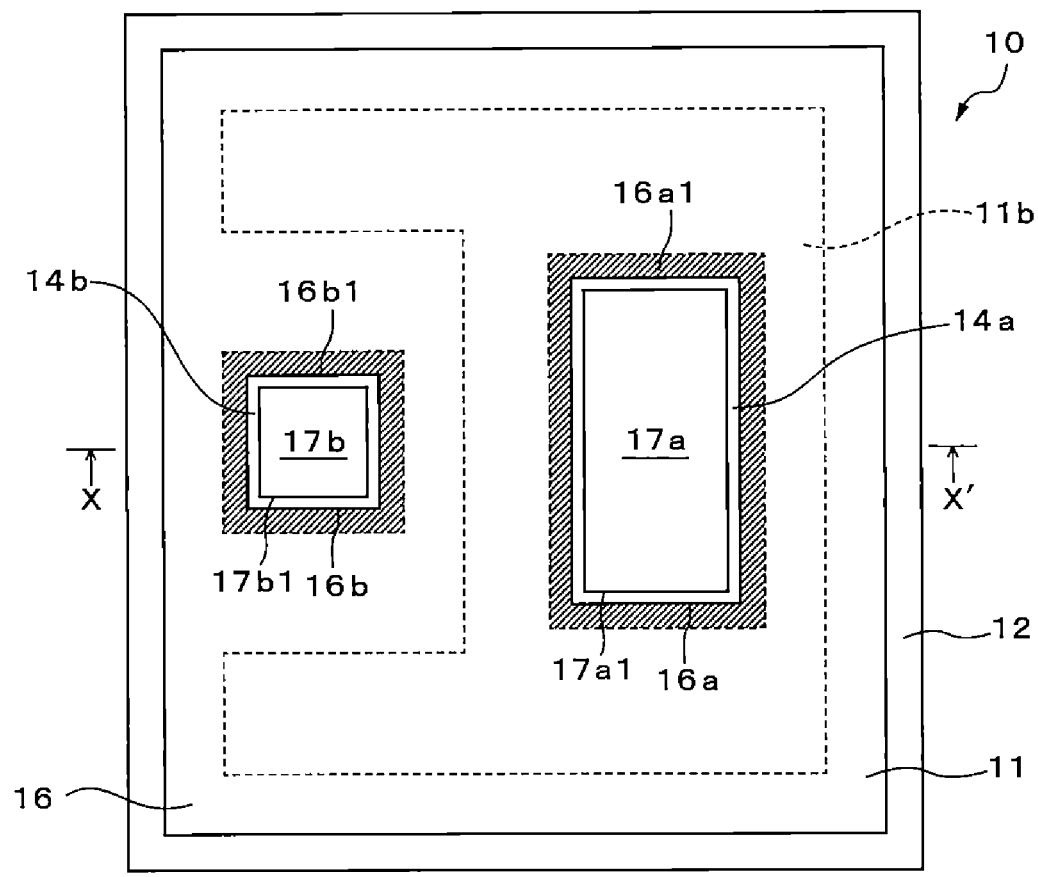
FIGS. 3A and 3B illustrate a modification example of the semiconductor module disclosed in the present specification.
Figure 3B:
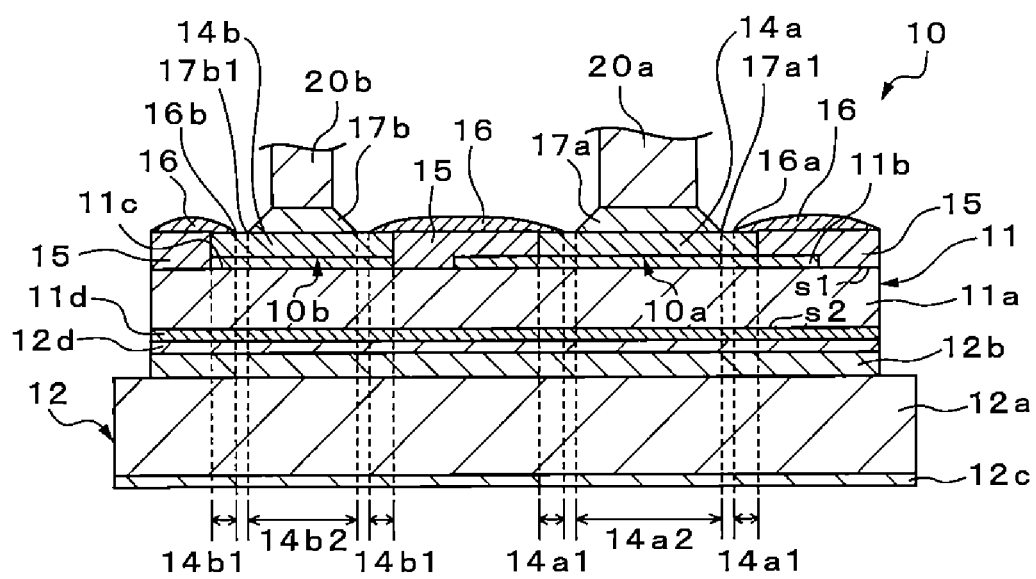

FIGS. 3A and 3B illustrates a modification example of the semiconductor module disclosed in the present specification. In a semiconductor module 10 according to the present modification example, in the first electrode structure 10a the second region 14a2-side edge 16a of the second protective layer 16 and the edge 17a1 of the solder portion 17a are separated from one another, and the bonding layer 14a is exposed between these edges. In other words, the inner peripheral edge of the second protective layer 16 and the outer peripheral edge of the solder portion 17a are separated, and the bonding layer 14a is exposed between these edges. This is to say that the first region 14a1 and the second region 14a2 are separated from one another.

In this case, in the region in which the bonding layer 14a is exposed, the bonding layer 14a is exposed to the atmosphere and undergoes oxidation, which inhibits wetting and spreading of solder.

During manufacture of the semiconductor module 10, arranging the second region 14a2-side edge 16a of the second protective layer 16 and the edge 17a1 of the solder portion 17a to be separated from one another (that is, arranging the inner peripheral edge of the second protective layer 16 and the outer peripheral edge of the solder portion 17a to be separated from one another) makes it possible to allocate margin in terms of placement accuracy when forming the second protective layer 16 and/or the solder portion 17a. This makes it possible to reduce the time and cost of the manufacturing process.

Moreover, in the second electrode structure 10b, the second region 14b2-side edge 16b of the second protective layer 16 and the edge 17b1 of the solder portion 17b are separated from one another, and the bonding layer 14b is exposed between these edges. In other words, the inner peripheral edge of the second protective layer 16 and the outer peripheral edge of the solder portion 17b are arranged so as to be separated from one another, which achieves the same advantageous effect as described above. The rest of the configuration of the present modification example is the same as in the embodiment described above.

Next, a preferred embodiment of a method of manufacturing the semiconductor module described above will be described below with reference to FIGS. 4 to 10.

Figure 4:
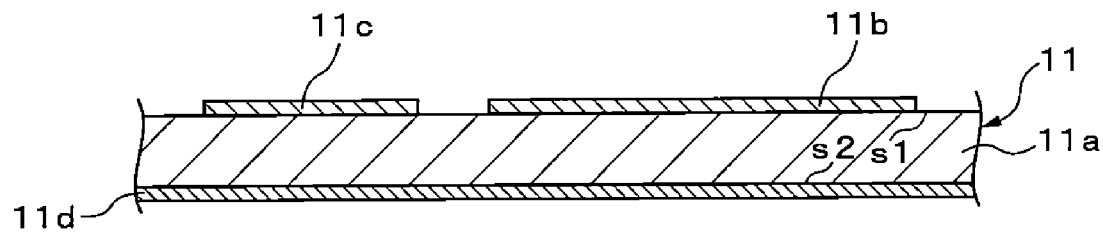
FIG. 4 illustrates a (first) step in an embodiment of a method of manufacturing the semiconductor module disclosed in the present specification.

First, as illustrated in FIG. 4, a semiconductor device 11 including a source electrode 11b, a gate electrode 11c, and a drain electrode 11d is prepared. Aluminum or an aluminum alloy can be used as the material for the source electrode 11b and the gate electrode 11c, for example. The source electrode 11b and the gate electrode 11c may be 5 μm in thickness, for example. Although only a single semiconductor device 11 is depicted in FIG. 4, the semiconductor device 11 is prepared in a form in which a plurality of semiconductor devices 11 are arranged on a single wafer. The following steps will be described for a single semiconductor device 11, but the same processes are also applied to the other semiconductor devices.

Figure 5:
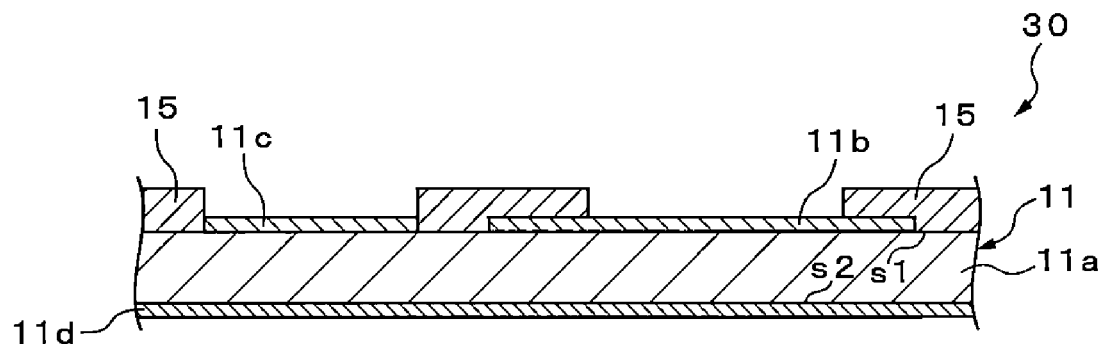
FIG. 5 illustrates a (second) step in the embodiment of the method of manufacturing the semiconductor module disclosed in the present specification.

Next, as illustrated in FIG. 5, a first protective layer 15 is formed on the semiconductor device 11, thereby yielding a semiconductor structure 30. The first protective layer 15 is formed on a first surface s1 of the semiconductor device 11 so as to leave the source electrode 11b and the gate electrode 11c exposed. The first protective layer 15 may cover the outer peripheries of the source electrode 11b and the gate electrode 11c. Whether the first protective layer 15 covers or does not cover the outer peripheries of the source electrode 11b and the gate electrode 11c may be selected as appropriate on the basis of the sizes of the source electrode 11b and the gate electrode 11c. Here, a case in which the outer periphery of the source electrode 11b is covered by the first protective layer 15 while the outer periphery of the gate electrode is not covered by the first protective layer 15 will be described. The first protective layer 15 is formed, for example, by applying a liquid polyimide or polyamide to the first surface s1 of the semiconductor device 11 so as to leave the source electrode 11b and the gate electrode 11c exposed and then applying heat to harden this material.

Figure 6:
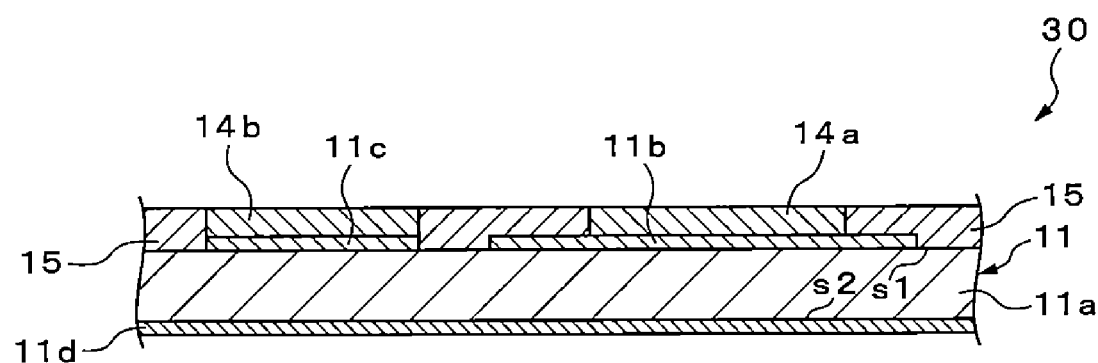
FIG. 6 illustrates a (third) step in the embodiment of the method of manufacturing the semiconductor module disclosed in the present specification.

Next, as illustrated in FIG. 6, a bonding layer 14a is formed on the source electrode 11b, and a bonding layer 14b is formed on the gate electrode 11c. The bonding layer 14a and the bonding layer 14b are formed using a plating technology such as electroless plating, for example. It is preferable that the bonding layer 14a and the bonding layer 14b be made of nickel, a nickel alloy, copper, or a copper alloy. More specifically, the bonding layer 14a and the bonding layer 14b may be formed as nickel phosphorus films using an electroless plating technology. The thickness of the bonding layer 14a and the bonding layer 14b may be set to 5 μm, for example.

Figure 7:
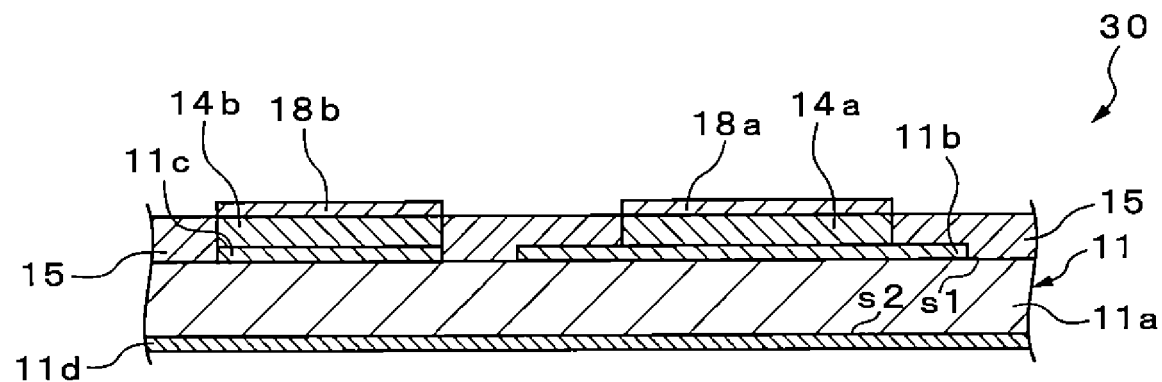
FIG. 7 illustrates a (fourth) step in the embodiment of the method of manufacturing the semiconductor module disclosed in the present specification.

Next, as illustrated in FIG. 7, an anti-oxidation layer 18a is formed on the bonding layer 14a, and an anti-oxidation layer 18b is formed on the bonding layer 14b. The anti-oxidation layer 18a and the anti-oxidation layer 18b prevent the bonding layer 14a and the bonding layer 14b from oxidizing. The anti-oxidation layer 18a and the anti-oxidation layer 18b are formed as gold or gold alloy films using a plating technology such as electroless plating, for example. It is preferable that the thickness of the anti-oxidation layer 18a and the anti-oxidation layer 18b be set in the range of 0.025 μm to 0.1 μm. A thickness of 0.025 μm ensures a thickness that makes it possible to prevent the bonding layer 14a and the bonding layer 14b from oxidizing. Moreover, a thickness of no more than 0.1 μm makes it possible to reduce material costs and maintain a uniform thickness.

Figure 8:
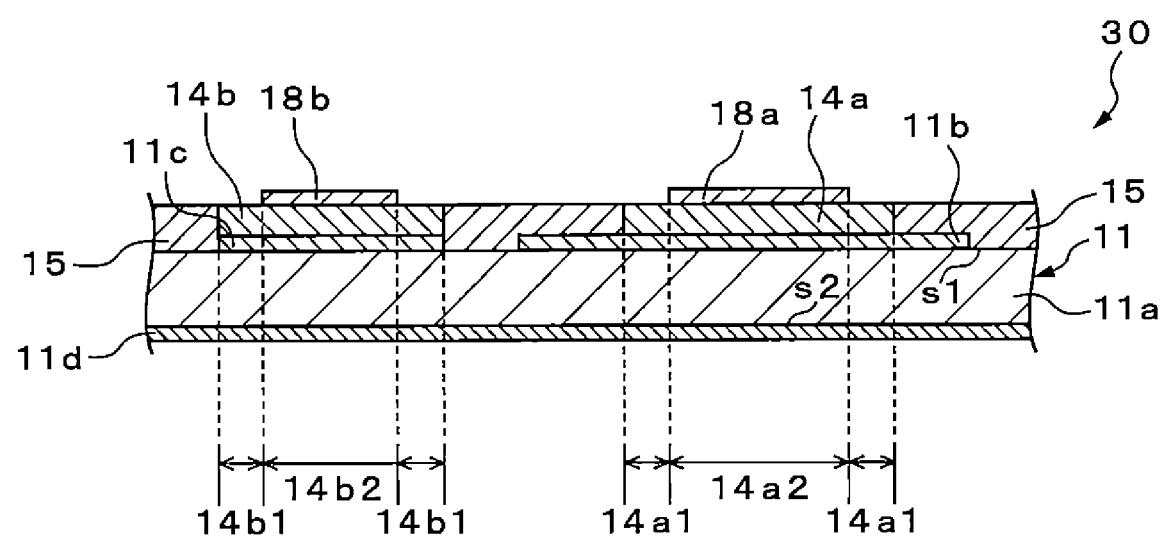
FIG. 8 illustrates a (fifth) step in the embodiment of the method of manufacturing the semiconductor module disclosed in the present specification.

Next, as illustrated in FIG. 8, the anti-oxidation layer 18a on a first region 14a1 of the bonding layer 14a is removed, and the first region 14a1 of the bonding layer 14a is exposed. Similarly, the anti-oxidation layer 18b on a first region 14b1 of the bonding layer 14b is removed, and the first region 14b1 of the bonding layer 14b is exposed. More specifically, a first mask (not illustrated in the figure) is formed on the first surface s1 of the semiconductor device 11 so as to leave only the anti-oxidation layer 18a on the first region 14a1 of the bonding layer 14a and the anti-oxidation layer 18b on the first region 14b1 of the bonding layer 14b exposed, and the portions of the anti-oxidation layer 18 that are exposed from the first mask are removed by etching. A wet etching process or a dry etching process such as plasma etching can be used for this etching. Moreover, as an alternative to etching, a blasting process may be used to remove the portions of the anti-oxidation layer 18 on the bonding layer 14a and the bonding layer 14b that are exposed from the mask. Alternatively, laser irradiation may be used to remove the portion of the anti-oxidation layer 18a on the first region 14a1 of the bonding layer 14a and the portion of the anti-oxidation layer 18b on the first region 14b1 of the bonding layer 14b.

It is preferable that the etching conditions, the particle size of particles used in a blasting process, the laser irradiation conditions, or the like described above be adjusted such that the arithmetic average roughness of the surface of the first region 14a1 and the first region 14b1 is greater than or equal to 1 μm and less than or equal to 6 μm. This allows a second protective layer 16 to mate with irregularities formed in the surfaces of the first region 14a1 and the first region 14b1, thereby increasing the bonding strength of the second protective layer 16 with these regions.

Figure 9:
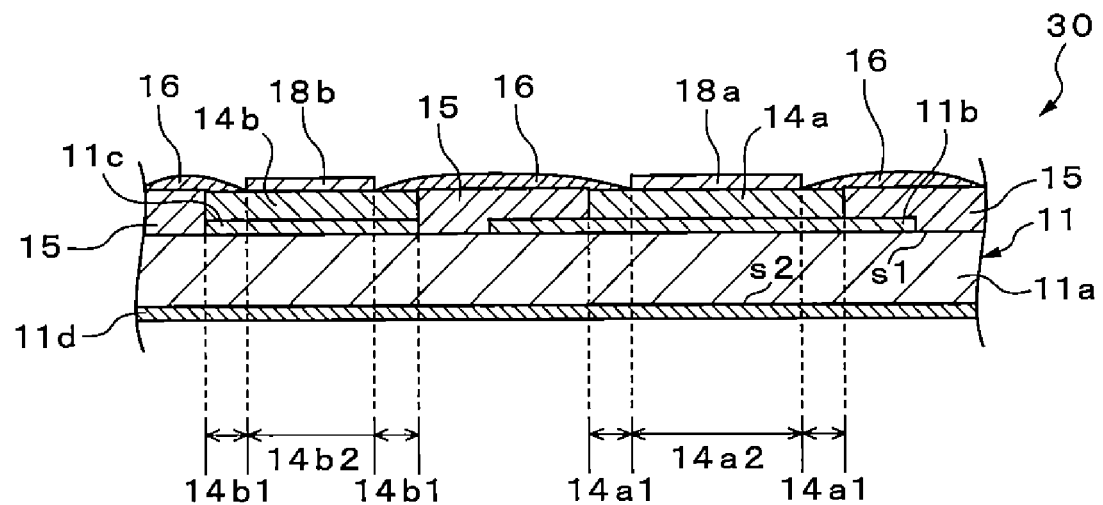
FIG. 9 illustrates a (sixth) step in the embodiment of the method of manufacturing the semiconductor module disclosed in the present specification.

Next, as illustrated in FIG. 9, the second protective layer 16 is formed on the first region 14a1 of the bonding layer 14a so as to cover the outer peripheral edge of the bonding layer 14a, and the second protective layer 16 is also formed on the first region 14b1 of the bonding layer 14b so as to cover the outer peripheral edge of the bonding layer 14b. The second protective layer 16 is formed covering the first protective layer 15 on the first surface s1 of the semiconductor device 11 so as to leave only the second region 14a2 of the bonding layer 14a and the second region 14b2 of the bonding layer 14b exposed. Here, it is preferable that the second protective layer 16 be formed so as to not cover onto the anti-oxidation layer 18a and the anti-oxidation layer 18b. This is because if the second protective layer 16 covers onto the anti-oxidation layer 18a and the anti-oxidation layer 18b, solder portions 17a and 17b (described later) become more difficult to bond to the second regions 14a2 and 14b2 of the bonding layers 14a and 14b.

The second protective layer 16 can be formed as follows, for example. In a first method, a second mask (not illustrated in the figures) is formed covering the first mask on the anti-oxidation layer 18a and the anti-oxidation layer 18b. Here, the second mask is formed so as to cover a portion of the first region 14a1 of the bonding layer 14a on a second region 14a2-side as well as a portion of the first region 14b1 of the bonding layer 14b on a second region 14b2-side. Then, the first mask that is not covered by the second mask is removed. Next, with the second region 14a2 of the anti-oxidation layer 18a and the second region 14b2 of the anti-oxidation layer 18b covered by the first mask, a liquid polyimide or polyamide may be applied to the first surface s1 of the semiconductor device 11 using a spin coating process, and then heat may be applied to harden this material and form the second protective layer 16. The heating conditions can be set to one hour at 350° C., for example. Then, the first mask is removed from on the anti-oxidation layer 18a and the anti-oxidation layer 18b.

In a second method, after removing the first mask used in the step in FIG. 8, a photosensitive polyimide or polyamide is applied to the first surface s1 of the semiconductor device 11 and then patterned and temporarily cured to form the second protective layer 16 on the first surface s1 of the semiconductor device 11. Then, the temporarily cured second protective layer 16 may be heated and fully cured to form the second protective layer 16.

In a third method, after removing the first mask used in the step in FIG. 8, a liquid polyimide or polyamide may be applied to a prescribed region on the first surface s1 of the semiconductor device 11 using an inkjet process and may then be heated and fully cured to form the second protective layer 16. Then, the plurality of semiconductor structures 30 formed on the single wafer are cut into individual semiconductor structures 30.

Figure 10:
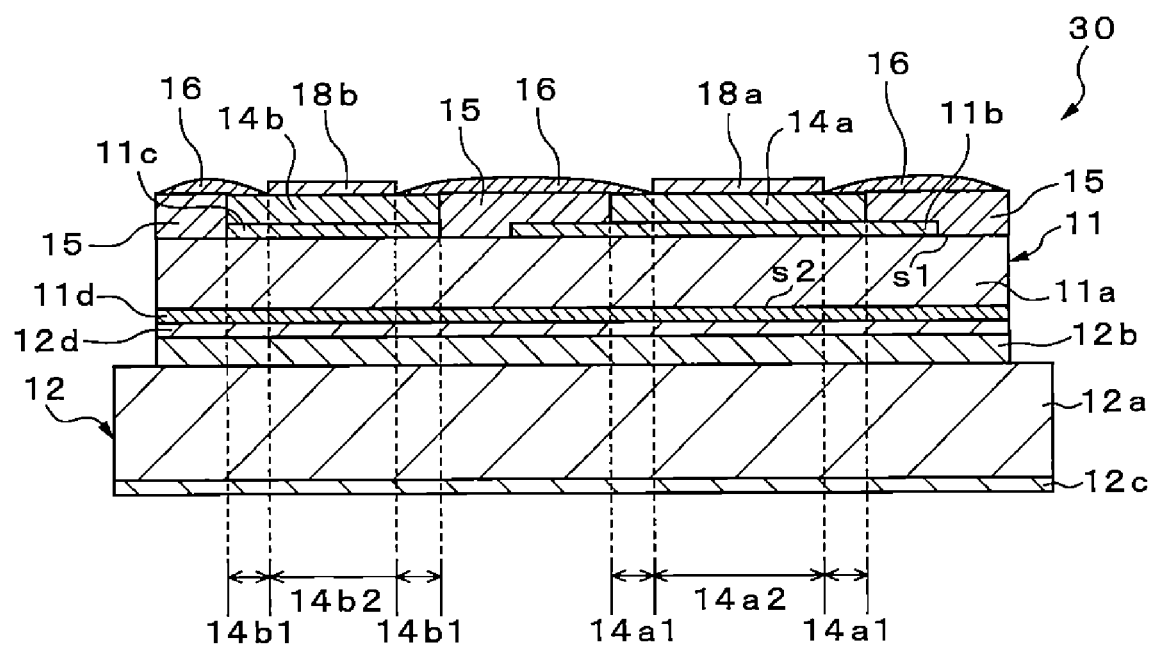
FIG. 10 illustrates a (seventh) step in the embodiment of the method of manufacturing the semiconductor module disclosed in the present specification.

Next, as illustrated in FIG. 10, in the semiconductor structure 30, the drain electrode 11d of the semiconductor device 11 is bonded onto a circuit substrate 12b of an insulating substrate 12 via a solder layer 12d.

Then, as illustrated in FIGS. 1A and 1B, a solder portion 17a is formed by using solder to electrically bond a wire 20a and the second region 14a2 of the bonding layer 14a in which the anti-oxidation layer 18a is arranged. The anti-oxidation layer 18a melts into the solder and becomes part of the solder portion 17a. In other words, once this happens the solder portion 17a contains gold. Similarly, a solder portion 17b is formed by using solder to electrically bond a wire 20b and the second region 14b2 of the bonding layer 14b in which the anti-oxidation layer 18b is arranged. The anti-oxidation layer 18b melts into the solder and becomes part of the solder portion 17b. Completing the steps described above yields the semiconductor module 10. Moreover, when using the solder portion 17a to bond together the bonding layer 14a and the wire 20a, if a portion of the bonding layer 14a is exposed on the surface, the surface of the bonding layer 14a is exposed to the atmosphere and undergoes oxidation, which inhibits wetting and spreading of the solder. In this case, the positions of the outer peripheral edge of the solder portion 17a and the outer peripheral edge of the anti-oxidation layer 18a match one another. Here, the "portion of the bonding layer 14a that is exposed on the surface" refers to the region sandwiched between the inner peripheral edge of the protective layer 16 and the outer peripheral edge of the solder portion 17a (or the outer peripheral edge of the anti-oxidation layer 18a) in the modification example of the semiconductor module according to the embodiment described above.

In the method of manufacturing the semiconductor module according to the present embodiment as described above, the second protective layer 16 is formed directly on top of the first regions 14a1 and 14b1 of the bonding layers 14a and 14b but is not formed on the second regions 14a2 and 14b2 of the bonding layers 14a and 14b, thereby forming a second protective layer 16 that exhibits high bonding strength with the bonding layers 14a and 14b.

In the present invention, the semiconductor module and method of manufacturing a semiconductor module according to the embodiments described above can be modified as appropriate without departing from the spirit of the present invention.

For example, although the semiconductor module according to the embodiments described above includes a MOSFET as a semiconductor device, the semiconductor device is not limited to this example. The semiconductor module may include a semiconductor device such as an IGBT or FWD as the semiconductor device, for example.

Moreover, although in the semiconductor module according to the embodiments described above a bonding layer is arranged on the source electrode of the semiconductor device, an electrode layer made of a conductor may be arranged between the source electrode and the bonding layer. The material and thickness of this conductor may be the same as those used for the source electrode. Similarly, an electrode layer made of a conductor may be arranged between the gate electrode of the semiconductor device and the respective bonding layer. The material and thickness of this conductor may be the same as those used for the gate electrode.

Furthermore, although in the semiconductor module according to the embodiments described above the second protective layer that protects the first electrode structure and the second electrode structure is shared therebetween, protective layers that protect the first electrode structure and the second electrode structure may be separate members.

In addition, although in the method of manufacturing the semiconductor module according to the embodiments described above the protective layer is formed on the first regions of the bonding layers so as to cover the outer peripheral edges of the bonding layers and then the second regions of the bonding layers in which the anti-oxidation layers are arranged are electrically bonded to wires using solder, the order of these steps may be reversed.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A method of manufacturing a semiconductor module, comprising:
   forming, on a semiconductor device, a bonding layer containing nickel or copper so as to be electrically connected to the semiconductor device;
   forming an anti-oxidation layer that contains gold on the bonding layer except for on an outer peripheral portion of the bonding layer including an outer peripheral edge of the bonding layer;
   forming a protective layer directly on the bonding layer so as to cover the outer peripheral edge of the bonding layer; and
   bonding a region of the bonding layer on which the anti-oxidation layer is formed to a wire using solder,
   wherein the bonding of the region of the bonding layer on which the anti-oxidation layer is formed to the wire using the solder causes the anti-oxidation layer to be dissolved in the solder.

2. The method according to claim 1, wherein the forming of the anti-oxidation layer includes:
   forming a layer that contains gold over an entire surface of the bonding layer; and
   removing a portion of said layer containing gold that is on the outer peripheral portion of the bonding layer so as to form the anti-oxidation layer.

3. The method according to claim 1, wherein the anti-oxidation layer and the protective layer are formed so that an outer peripheral edge of the anti-oxidation layer coincides with as an inner peripheral edge of the protective layer.

4. The method according to claim 1, wherein the anti-oxidation layer and the protective layer are formed so that an outer peripheral edge of the anti-oxidation layer is positioned further inwards than an inner peripheral edge of the protective layer.

5. The method according to claim 2, wherein the removing of the portion of said layer containing gold that is on the outer peripheral portion of the bonding layer causes an exposed surface of the outer peripheral portion of the bonding layer to have an arithmetic average roughness of greater than or equal to 1 μm and less than or equal to 6 μm.

6. The method according to claim 3,
   wherein the forming of the anti-oxidation layer includes:
      forming a layer that contains gold over an entire surface of the bonding layer; and
      removing a portion of said layer containing gold that is on the outer peripheral portion of the bonding layer so as to form the anti-oxidation layer, and
   wherein the removing of the portion of said layer containing gold that is on the outer peripheral portion of the bonding layer causes an exposed surface of the outer peripheral portion of the bonding layer to have an arithmetic average roughness of greater than or equal to 1 μm and less than or equal to 6 μm.

7. The method according to claim 4,
   wherein the forming of the anti-oxidation layer includes:
      forming a layer that contains gold over an entire surface of the bonding layer; and
      removing a portion of said layer containing gold that is on the outer peripheral portion of the bonding layer so as to form the anti-oxidation layer, and
   wherein the removing of the portion of said layer containing gold that is on the outer peripheral portion of the bonding layer causes an exposed surface of the outer peripheral portion of the bonding layer to have an arithmetic average roughness of greater than or equal to 1 μm and less than or equal to 6 μm.

8. A method of manufacturing a semiconductor module, comprising:
forming, on a semiconductor device, a bonding layer containing nickel or copper so as to be electrically connected to the semiconductor device;
forming an anti-oxidation layer that contains gold on the bonding layer except for on an outer peripheral portion of the bonding layer including an outer peripheral edge of the bonding layer;
forming a protective layer directly on the bonding layer so as to cover the outer peripheral edge of the bonding layer; and
bonding a region of the bonding layer on which the anti-oxidation layer is formed to a wire using solder,
wherein the forming of the anti-oxidation layer includes:
forming a layer that contains gold over an entire surface of the bonding layer; and
removing a portion of said layer containing gold that is on the outer peripheral portion of the bonding layer so as to form the anti-oxidation layer.

9. The method according to claim 8, wherein the anti-oxidation layer and the protective layer are formed so that an outer peripheral edge of the anti-oxidation layer coincides with as an inner peripheral edge of the protective layer.

10. The method according to claim 8, wherein the anti-oxidation layer and the protective layer are formed so that an outer peripheral edge of the anti-oxidation layer is positioned further inwards than an inner peripheral edge of the protective layer.

11. The method according to claim 8, wherein the removing of the portion of said layer containing gold that is on the outer peripheral portion of the bonding layer causes an exposed surface of the outer peripheral portion of the bonding layer to have an arithmetic average roughness of greater than or equal to 1 μm and less than or equal to 6 μm.

12. The method according to claim 9, wherein the removing of the portion of said layer containing gold that is on the outer peripheral portion of the bonding layer causes an exposed surface of the outer peripheral portion of the bonding layer to have an arithmetic average roughness of greater than or equal to 1 μm and less than or equal to 6 μm.

13. The method according to claim 10, wherein the removing of the portion of said layer containing gold that is on the outer peripheral portion of the bonding layer causes an exposed surface of the outer peripheral portion of the bonding layer to have an arithmetic average roughness of greater than or equal to 1 μm and less than or equal to 6 μm.

14. A method of manufacturing a semiconductor module, comprising:
forming, on a semiconductor device, a bonding layer containing nickel or copper so as to be electrically connected to the semiconductor device, an entire back surface of the bonding layer being electrically connected to and in direct contact with an electrode in the semiconductor device;
forming an anti-oxidation layer that contains gold on the bonding layer except for on an outer peripheral portion of the bonding layer including an outer peripheral edge of the bonding layer;
forming a protective layer directly on the bonding layer so as to cover the outer peripheral edge of the bonding layer; and
bonding a region of the bonding layer on which the anti-oxidation layer is formed to a wire using solder,
wherein the protective layer is disposed directly on a top surface of the outer peripheral portion of the bonding layer on which the solder portion is absent, covering the outer peripheral edge of the bonding layer, and
wherein the protective layer contains polyimide or polyamide.

15. The method according to claim 14, wherein the forming of the anti-oxidation layer includes:
forming a layer that contains gold over an entire surface of the bonding layer; and
removing a portion of said layer containing gold that is on the outer peripheral portion of the bonding layer so as to form the anti-oxidation layer.

16. The method according to claim 14, wherein the anti-oxidation layer and the protective layer are formed so that an outer peripheral edge of the anti-oxidation layer coincides with as an inner peripheral edge of the protective layer.

17. The method according to claim 14, wherein the anti-oxidation layer and the protective layer are formed so that an outer peripheral edge of the anti-oxidation layer is positioned further inwards than an inner peripheral edge of the protective layer.

18. The method according to claim 14, wherein the bonding of the region of the bonding layer on which the anti-oxidation layer is formed to the wire using the solder causes the anti-oxidation layer to be dissolved in the solder.

19. The method according to claim 15, wherein the removing of the portion of said layer containing gold that is on the outer peripheral portion of the bonding layer causes an exposed surface of the outer peripheral portion of the bonding layer to have an arithmetic average roughness of greater than or equal to 1 μm and less than or equal to 6 μm.

20. The method according to claim 16,
wherein the forming of the anti-oxidation layer includes:
forming a layer that contains gold over an entire surface of the bonding layer; and
removing a portion of said layer containing gold that is on the outer peripheral portion of the bonding layer so as to form the anti-oxidation layer, and
wherein the removing of the portion of said layer containing gold that is on the outer peripheral portion of the bonding layer causes an exposed surface of the outer peripheral portion of the bonding layer to have an arithmetic average roughness of greater than or equal to 1 μm and less than or equal to 6 μm.

* * * * *